United States Patent [19]

Deppe et al.

[11] Patent Number: 5,206,871
[45] Date of Patent: Apr. 27, 1993

[54] OPTICAL DEVICES WITH ELECTRON-BEAM EVAPORATED MULTILAYER MIRROR

[75] Inventors: Dennis G. Deppe, Austin, Tex.; Niloy K. Dutta, Colonia, N.J.; Erdmann F. Schubert, New Providence, N.J.; Li-Wei Tu, Westfield; George J. Zydzik, Columbia, N.J.

[73] Assignee: AT&T Bell Laboratories, Murray Hill, N.J.

[21] Appl. No.: 815,311

[22] Filed: Dec. 27, 1991

[51] Int. Cl.$^5$ .............................. H01S 3/19
[52] U.S. Cl. ........................ 372/45; 372/96
[58] Field of Search ............... 372/45, 96, 43, 44

[56] References Cited

U.S. PATENT DOCUMENTS 3,984,581 10/1976 Dobler et al. ................. 427/35
5,018,157 5/1991 Deppe et al. .................. 372/45

FOREIGN PATENT DOCUMENTS 0079280 4/1986 Japan .......................... 372/45
0245984 10/1988 Japan .......................... 372/45
1382401 1/1975 United Kingdom ............. 372/45

OTHER PUBLICATIONS

H. Soda et al. "GaInAsP/InP Surface Emitting Injection Lasers," *Japanese Journal of Applied Physics*, vol. 18, No. 12, 1979, pp. 2329–2330.
H. Soda et al. "GaInAsP/InP Surface Emitting Injection Lasers with Short Cavity Length," *IEEE Journal of Quantum Electronics*, vol. QE-19, No. 6 Jun. 1983, pp. 1035–1041.
S. Kinoshita et al. "GaAlAs/GaAs Surface Emitting Laser With High Reflective TiO$_2$/SiO$_2$ Multilayer Bragg Reflector", *Japanese Jrnl. Applied Physics*, vol. 26, No. 3, Mar. 1987, pp. 410–415.
I. Watanabe, et al. "GaInAsP/InP CBH Surface-Emitting Laser With a Dielectric Multilayer Reflector", *Japanese Jrnl. Applied Physics* vol. 26, No. 9, Sep. 1987, pp. 1598–1599.
K. Iga et al., "Recent Advances of Surface Emitting Semiconductor Lasers", *Optoelectronics*, vol. 3, No. 2, Dec. 1988, pp. 131–142.
L. M. Zinkiewicz et al. "High-Power Vertical-Cavity Surface-Emitting AlGaAs/GaAs Diode Lasers", *Appl. Phys. Lett.* 54 (20, 15 May 1989).

*Primary Examiner*—Georgia Y. Epps
*Attorney, Agent, or Firm*—Oleg E. Alber

[57] ABSTRACT

This invention embodies a Vertical Cavity Surface Emitting Laser with a top mirror comprising at least one pair of quarterwave layers, each pair consisting of a low index of refraction layer and a high index of refraction layer, the high index of refraction layer being a semiconductor chosen from GaP and ZnS and the low index of refraction layer being chosen from borosilicate glass (BSG) CaF$_2$, MgF$_2$ and NaF. Especially useful in vertical cavity surface emitting lasers are mirrors formed by a stack of a plurality of pairs of GaP/BSG or ZnS/CdF$_2$. Such mirrors have a high reflectivity characteristics required for an efficient operation of the laser. The GaP/BSG or ZnS/CaF$_2$ mirror structure represents a considerable improvement over previous designs for VCSELs in terms of ultimate reflectivity, low loss, and post growth processing compatibility.

9 Claims, 3 Drawing Sheets

OPTICAL DEVICES WITH ELECTRON-BEAM EVAPORATED MULTILAYER MIRROR

FIELD OF THE INVENTION

The invention concerns Vertical Cavity Surface Emitting Lasers.

BACKGROUND OF THE INVENTION

Stacks of alternating high and low refractive index layers serve as mirrors in Vertical Cavity Surface Emitting Lasers, hereinafter referred to as VCSELs. The task is to find suitable materials for the high and low index layers which maximize a ratio of the high index refractive order to the low index refractive order, and which could be deposited in a manner compatible with the semiconductor device processing.

A VCSEL is attractive as a device in which the lasing cavity is perpendicular to the top surface of a laser chip, which is small and which may be produced by planar technology. This can lead to a promising future in high density laser arrays, high data transmission in optical communication systems, ultra high parallel processing in optical communication systems, as well as supplying a route for data transmission between electronic chips. Furthermore, the circular-like nature of their beams allows one to efficiently couple the laser light into circular optical fibers.

In the VCSEL the light output is in the film growth direction which is usually parallel to the direction of the injection current. Due to this feature, the mirror through which the emission takes place and the electrical contact physically occupy the same side of the laser structure, i.e. either the top or the bottom of the device. The mirror is located approximately in the center of the surface while the electrode is located peripherally of the mirror. An example of a surface emitting laser with a coplanar mirror/electrode arrangement in which a gold layer with a thickness of a few tenths of a micrometer acts as the mirror through which laser-emission takes place, may be found in articles by H. Soda et al., entitled "GaInAsP/InP Surface Emitting Injection Lasers," *Japanese Journal of Applied Physics*, Vol. 18, No. 12, 1979, pp. 2329-2230; and by H. Soda et al. entitled "GaInAsP/InP Surface Emitting Injection Lasers with Short Cavity Length," *IEEE Journal of Quantum Electronics*, Vol. QE-16, No. 6, Jun. 1983, pp. 1035-1041. However, S. Kinoshita pointed out that such mirrors lead to low quantum efficiency primarily due to absorption of lasing emission by the gold mirror and suggested the use of a stack of pairs of dielectric layers as the top mirror, one layer of each pair having a higher index of refraction than the other layer of the pair. See an article by Susumu Kinoshita et al. entitled "GaAlAs/GaAs Surface Emitting Laser with High Reflective TiO$_2$/-SiO$_2$ Multilayer Bragg Reflector," *Japanese Journal of Applied Physics*, vol. 26, No. 3, March 1987, pp. 410-415; L. M. Zinkiewicz et al., "High Power Vertical-Cavity Surface-Emitting AlGaAs/GaAs Diode Lasers," *Appl. Phys. Letters*, Vol. 54, No. 20, 15 May 1989, pp. 1959-1961; and Kenichi Iga, "Recent Advances of Surface Emitting Semiconductor Lasers," *Optoelectronics-Devices and Technologies*, Vol. 3, No. 2, December 1988, pp. 131-142.

TiO$_2$ and ZrO$_2$ quarter-wave $\left(\frac{\lambda}{4n}\right)$ dielectric layers have been typically paired with SiO$_2$ quarter-wave layers. The number of pairs is selected to obtain a maximum performance reflectivity. However, the mirror structure of alternating TiO$_2$ (or ZrO$_2$) and SiO$_2$ quarter-wave layers have not yielded expected performance, in terms of reflectivity. Theoretically, the optical performance of a stacked mirror structure should approach 100 percent. Unfortunately, presently obtainable performance falls within a broad range of from 90 to 99 percent. The problem resides, primarily, with the high index layer materials. This shortfall is, most likely, due to the difficulty in obtaining sufficiently high quality TiO$_2$ (or ZrO$_2$) layers on a reproducible basis. Electron-beam deposition of coatings, such as TiO$_2$ (or ZrO$_2$), requires addition of oxygen in the deposition process to get the proper stoiciometry for a desired refractive index. Addition of oxygen is needed to avoid formation of unwanted, oxygen-deficient phases, such as Ti, TiO, Ti$_2$O$_3$, Ti$_3$O$_5$, which occur due to an oxygen shortage. This requirement makes it difficult to reproducibly form the TiO$_2$ layer.

Several single crystal semiconductors with high index of refraction, such as Al$_x$Ga$_{1-x}$As or GaInP, which possess the desired properties when epitaxially deposited may be used in place of TiO$_2$ or ZrO$_2$ layers; however, the epitaxial growth of these materials requires temperatures of ~600°-800° C. along with sophisticated, expensive growth apparatus. These materials are poorly suited for deposition in a device post-processing wherein temperatures above 300°-350° C. are to be avoided. Therefore, there is still a need for high stability, high performance mirrors for use in VCSELs with high quality coatings which are easily reproducible at conditions compatible with the device processing and which could be also produced in a simplified manner utilizing planar technology.

SUMMARY OF THE INVENTION

This invention embodies a VCSEL with a top mirror comprising at least one pair of quarterwave layers, each pair consisting of a low index of refraction layer and a high index of refraction layer, the high index of refraction layer being a semiconductor chosen from GaP and ZnS and the low index of refraction layer being chosen from borosilicate glass (BSG), CaF$_2$, MgF$_2$ and NaF. Especially useful in vertical cavity surface emitting lasers are mirrors formed by a stack of a plurality of pairs of GaP/BSG or ZnS/CdF$_2$. Such mirrors are produced by e-beam deposition in the absence of oxygen and have a high reflectivity characteristics required for an efficient operation of the laser. The GaP/BSG or ZnS/CaF$_2$ mirror structures represent a considerable improvement over previous designs for VCSELs in terms of ultimate reflectivity, low loss, and post growth processing compatibility.

DETAILED DESCRIPTION

The applicants have discovered that such a semiconductor materials as GaP and ZnS represent an excellent choice for the high index layers in mirrors for use in VCSELs especially if combined with such low index dielectric layers as $CaF_2$, $MgF_2$, NaF and borosilicate glass (BSG). The index of refraction of GaP is 3.45, of ZnS is 2.35, and BSC, $CaF_2$, $MgF_2$, NaF the index of refraction is 1.46, 1.42, 1.389, and 1.317, respectively. GaP and ZnS are compound semiconductor which can be deposited by electron-beam (E-beam) evaporation in the form of amorphous layers, at relatively low substrate temperatures and without the need for oxygen supply during the deposition. E-beam evaporation, a relatively inexpensive technique, produces no significant damage to the semiconductor surface and permits in situ monitoring of the layer thickness. E-beam evaporation is well-known in the art and, thus, does not need any further elaboration. For an example of a suitable apparatus for a two layer deposition by e-beam technique see the article by Susumu Kinoshita, et al., supra, or U.S. Pat. No. 3,984,581 issued to Herman R. Dobler et al. on Oct. 5, 1976.

E-beam deposition of GaP and ZnS in absence of oxygen leads to deposits which are in an amorphous rather than crystalline state if the substrate temperature is maintained during deposition at a temperature within a range of from room temperature to 250° C. These temperatures are compatible with present commonly used device processes, such as oxide deposition or metallizations. Although the deposited layers are not single crystal, absorption losses are low for wavelengths within a range of from 0.5 to 1.6 μm, preferably from 0.5 to 1.1 μm and most preferably from 0.85 to 0.88 μm (emission wavelength of bulk GaAs). Good quality GaP and ZnS layers are obtained independently of the substrate material making such mirror structures as GaP/BSG or $ZnS/CaF_2$ readily reproducible. In contrast to the use of $TiO_2$ or unmodified $ZrO_2$, in combination with $SiO_2$ layers, control of film stoichiometry using GaP or ZnS as a high index coating is not a problem, and leads to an excellent reproducibility.

Figure 1:
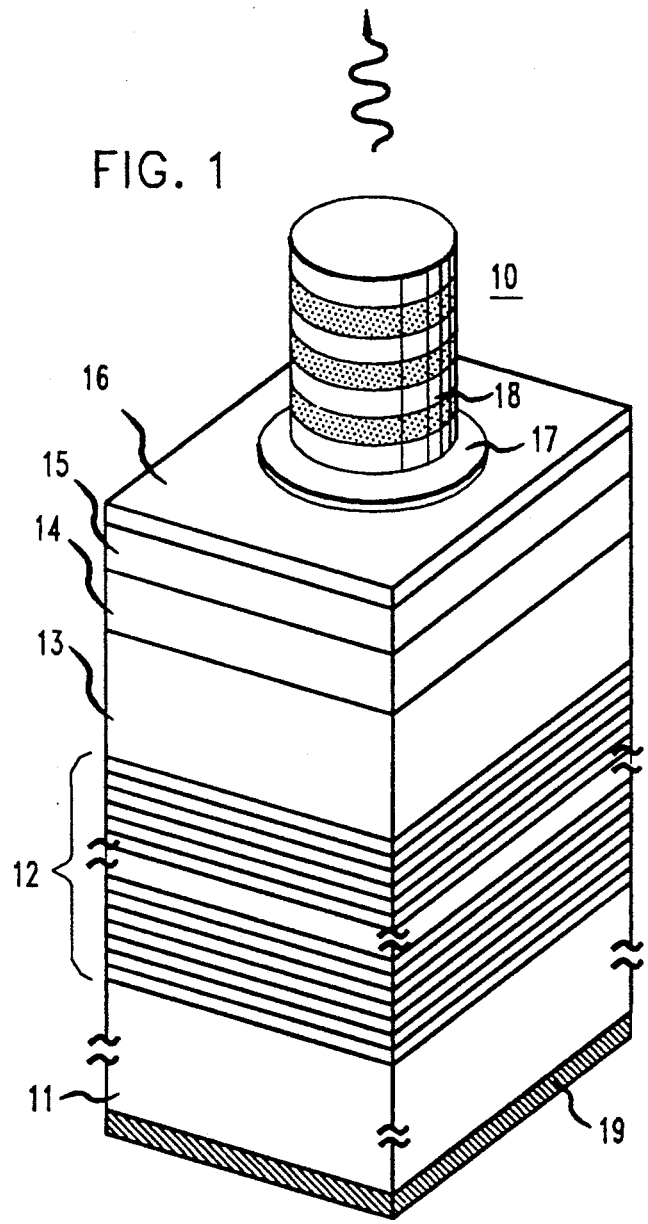
FIG. 1 is a cross-sectional view of a structure of a VCSE Laser.

FIG. 1 is a schematic representation of a VCSEL according to this invention, denominated generally as 10. For reasons of clarity elements of the VCSEL are not drawn to scale. VCSEL 10 comprises a substrate 11; a quarter-wave stack of a plurality of pairs of semiconductor layers forming a bottom mirror, 12, one layer of each pair having a refractive index different from the refractive index of another layer of the pair; a first confining layer, 13; an active layer, 14; a second confining layer, 15; a highly-doped contact layer, 16; a metal ring which acts as a non-alloyed ohmic top electrode, 17, of the device; a second quarter-wave stack of a plurality of pairs of layers forming a top mirror, 18, one layer of each pair having a refractive index different from the refractive index of another layer of the pair; and a bottom electrode, 19, in contact with the bottom surface of substrate 11. While not shown, additional confining and buffer layers may be included into the laser structure. The number of pairs of layers is arbitrarily shown as being 3; however, this number may be anyone within a range of from 2 to 20.

Construction of VCSEL 10, in accordance with the invention, may be described as being generally as follows:

Substrate 11 is an n+-type III-V or II-VI semiconductor, such as GaAs, GaInAs, InP, GaInP, GaInPAs, AlAs, AlGaAs, AlGaInAs, AlInP, AlInPAs, AlGaInPAs and other related group III-V or II-VI compound semiconductors. Typically, the thickness of the substrate ranges from 100 to 500 μm and the doping concentration of the substrate ranges from $1 \times 10^{17}$ to $1 \times 10^{19}$ cm$^{-3}$. In some applications, such as opto-electronic integrated circuitry, substrate 11 may be first grown on a master substrate of silicon, which is in common to a number of devices grown on the master substrate.

Quarter-wave stack 12 is composed of a plurality of pairs (or periods) of layers of n+-type semiconductor, such as GaAs, GaInAs, InP, GaInP, GaInAsP, AlAs, AlGaAs, AlInP, AlGaInP, AlGaInAsP, the semiconductor layers forming a bottom multilayer distributed Bragg reflector (DBR) mirror with a number of pairs typically ranging from 10 to 40. One semiconductor layer in each pair has a higher index of refraction than the other semiconductor layer of the pair. The thickness of each semiconductor layer in the pair equals $$\frac{\lambda}{4n},$$

wherein λ is the optical wavelength of the laser device and n is the refractive index of the layer. For example, for a device with an active region lasing at λ≈0.87 μm, such as a GaAs-based laser, a quarter-wave stack of pairs of such semiconductors as GaAs and AlAs with refractive indices of 3.64 and 2.97, respectively, will consist of 60 nm thick GaAs layer and 73 nm thick AlAs layer while a stack of $Al_{0.05}Ga_{0.95}As$ and AlAs will consist of pairs of layers 62 nm and 73 nm thick each, respectively.

First confining layer 13 and second confining layer 15 are provided to confine active region 14 and to adjust the length (L) of an optical cavity (that is, the thickness of the active region). The optical cavity length should be 2L=N·λ, wherein N is an integer and λ is an operating optical wavelength of the laser. Typically, the thickness of each confining layer ranges from 0 to 3 μm. To obtain constructive interference, the thickness of the confining layers should be a multiple of $$\frac{\lambda}{4n}.$$

In the preferred embodiment the confining regions are of $Al_xGa_{1-x}As$, with x ranging from 0.1 to 0.4.

Active region 14 is a region in which electrons (−) and holes (+) recombine providing, under proper stimulation, a lasing emission. In the preferred embodiment, the active region is a lightly doped ($1 \times 10^{16} - 5 \times 10^{17}$ cm$^{-3}$) layer of GaAs with a thickness within a range from 0.1 to 1 μm. The single layer may be a homogeneous semiconductor or a single or multiple quantum well (QW) structure, composed of a narrower gap semiconductor confined by a wider gap semiconductor. Alternatively, the single layer forming the active region may be replaced by a superlattice structure which is a multiquantum well structure with very thin barriers.

Highly doped contact layer 16 is provided in thickness of from 0.01 to 0.1 μm to facilitate establishing a non-alloyed ohmic contact between confining layer 15 and ring electrode 17. Typically, the doping concentration in the contact layer ranges from $1 \times 10^{19}$ to $1 \times 10^{20}$ cm$^{-3}$.

Electrode 17 is a non-alloyed ohmic contact. Electrode 17 is of a metal selected from such metal composites as AuBe and AuZn deposited in a thickness of from 5 to 400 nm thick in the form of an annulus with from 1.0 to 50 μm outer diameter and from 0.5-25 μm inner diameter. Such contacts are deposited by evaporation at temperatures ranging from 20° C. to 500° C., preferably from 20° C. to 250° C. Higher temperatures could result in undesirable alloying of the metal into the semiconductor. Additionally, a thin layer of such metal as Pt may be positioned between contact layer 16 and the metal composite.

Top mirror 18 is a multilayer Bragg reflector including from 2 to 20 pairs of high index and low index layers stacked one upon another in a columnar fashion. In one preferred embodiment the high index layers are GaP and the low index layers are borosilicate glass (BSG) such as Vycor ®. In another preferred embodiment, the high index layers are ZnS layers and the low index layers are CaF$_2$ layers.

Metal electrode 19 from 1 to 10 μm thick is formed on the bottom surface of substrate 11 to provide for current flow perpendicularly through the active region to cause lasing emission. The laser may be mounted with electrode 19 in contact with a heat-sink plate, e.g. of copper or some or some other heat-conductive material which does not contaminate the materials of the laser.

Semiconductor layers 12 through 16 can be grown upon substrate 11 by such known methods as metal organic vapor phase epitaxy (MOVPE), also known as metal organic chemical vapor deposition (MOCVD), or by Molecular Beam Epitaxy (MBE) or by hydride vapor phase epitaxy (VPE). In the preferred embodiment, the VCSEL structures are grown by the MBE technology in a Varian Gen II MBE system on heavily doped GaAs substrates 11. After layers 12 through 16 are grown, the partially formed structure is transferred to a separate high vacuum chamber where a metal layer is deposited by electron beam evaporation on exposed portions of contact layer 16 as a non-alloyed ohmic contact in a thickness sufficient to provide desired electrical conductivity. Electrode 17 may be deposited through a photolithographically formed mask or through a shadow mask blocking off areas on which deposition of the metal electrode is to be excluded, such as the centrally located area of the contact layer. Following the top electrode deposition step, the top mirror stack is deposited in absence of oxygen through a shadow mask by electron beam evaporation either in the same or in another chamber. Bottom electrode layer 19, e.g., of In, may then be formed on the bottom surface of substrate 11. Finally, the bottom side of the laser may be mounted via the In electrode or by means of a conductive adhesive, such as epoxy, on a copper slab which serves as a heat sink in common to other devices.

The flow of electrons from top electrode 17 may be restrictively directed to the active layer through a small contrally located window (not shown) defined in confining layer 15. This central area preferably corresponds substantially to the central opening in the annular electrode. It maybe produced conveniently by ion-implanting the peripheral area of confining layer 15 with ions which do not affect the conductivity type of the material in which they are implanted. Proton ions, such as H$^+$,O$^+$ or He$^+$ are implanted typically in concentrations ranging from $1 \times 10^{18}$ to $5 \times 10^{19}$ per cm$^3$. They are implanted into the peripheral area of confining layer 15 prior to the deposition of contact layer 16, thus defining a window for the centrally restricted flow of electrons to active layer 14.

In the exemplary preferred embodiment, the VCSEL is an Al$_x$Ga$_{1-x}$As laser structure, with x ranging from 0 to 1.0, comprising in an ascending sequence 1 to 2 μm thick In electrode 19, about 500 μm thick (001)-oriented heavily doped ($2 \times 10^{18}$cm$^{-3}$) n$^+$-GaAs substrate 11, bottom mirror 12 consisting of a quarter-wave stack of 30 pairs of n$^+$-type ($5 \times 10^{17}$-$5 \times 10^{18}$ cm$^{-3}$) semiconductor layers forming multilayer distributed Bragg reflector (DBR) mirror, each pair of the stack consisting of a 73 nm thick layer of n$^+$-AlAs and 62 nm thick layer of Al$_{0.05}$Ga$_{0.95}$As. The reflectivity spectrum of this DBR structure, as measured with a Perkin-Elmer Lambda 9 UV/VIS/NIR Spectrophotometer, showed a broad high reflectivity band centered at ~0.87 μm with a reflectivity>99 percent. The bottom mirror is followed by first confinement layer 13 of n$^+$-Al$_{0.20}$Ga$_{0.80}$As ($5 \times 10^{17}$cm$^{-3}$) about 3 μm thick, lightly doped ($5 \times 10^{16}$cm$^{-3}$) active layer 14 of p$^-$-GaAs about 0.6 μm thick, and second confinement layer 15 of p$^+$-Al$_{0.30}$Ga$_{0.70}$As ($5 \times 10^{16}$cm$^{-3}$) about 0.5 μm thick. A heavily doped ($5 \times 10^{19}$cm$^{-3}$) contact layer 16 of p$^+$-Al$_{0.10}$Ga$_{0.90}$As, about 0.06 μm thick, is deposited on confining layer 15 for ohmic contact purpose. Electrode layer 17 of AuBe about 200 nm thick is formed, through a suitable mask, on top of contact layer 16 under conditions leading to a non-alloyed ohmic contact. Electrode layer 17 is in the form of an annulus with from 1.0 to 50.0 μm, preferably 5 to 25 μm, outer diameter and about from 0.5 to 20 μm, preferably 2 to 20 μm, inner diameter.

A plurality of alternating layers of GaP and BSG or ZnS and CaF$_2$, forming top mirror 18 are then deposited by e-beam evaporation. These layers are deposited through a mask so as to form a cylindrical column of alternating layers. The deposition begins with a BSG (or CaF$_2$) layer followed by the deposition of GaP (or ZnS, respectively) layer and repetition of the deposit sequence until a desired number, e.g., 20, of BSG-GaP (or CaF$_2$-ZnS) pairs are deposited. The stack is then preferably capped off with another BSG (or CaF$_2$) layer.

The source material for deposition of GaP layers was polycrystalline GaP and for deposition of BSG layers was fused BSG. Similarly, the source material for deposition of ZnS layers was crystalline ZnS and for deposition of CaF$_2$ layers was crystalline CaF$_2$. After bombardment of the source materials was initiated, an about 150 nm thick BSG (about 153 nm thick CaF$_2$) layer was permitted to be deposited on an adjacent central region of contact layer 16 and in partially overlapping relation on exposed portions of contact 17 while the deposition of GaP was avoided by means of a shutter. Thereafter about 64 nm thick GaP (about 93 nm thick ZnS) layer was deposited while the deposition of the BSG layer was interrupted. This procedure sequence was repeated until a desired number of pairs (periods) of BSG and GaP (or CaF$_2$ and ZnS, respectively) layers was deposited. During the deposition, the vacuum was kept within a range of from $1 \times 10^{-4}$ to $1 \times 10^{-7}$ Torr. Outer diameter of the stack was larger than the inner diameter of electrode 17 so as to overlap the electrode by from 0.2 to 5 μm. During the deposition the substrates were held at temperatures of 125° C.–250° C. These temperatures are compatible with device processes, such as oxide deposition or metallization, commonly used as a post semiconductor growth processing. These temperatures are also conducive to the formation of amorphous films of GaP and ZnS in absence of an oxygen atmosphere. E-beam evaporation of alternating GaP and BSG layers or ZnS and CaF$_2$ layers in accordance with this invention produces desired index of refraction without introduction of oxygen into the evaporation chamber. Thus, there was no need to introduce oxygen into the chamber, and none was introduced.

Figure 2:
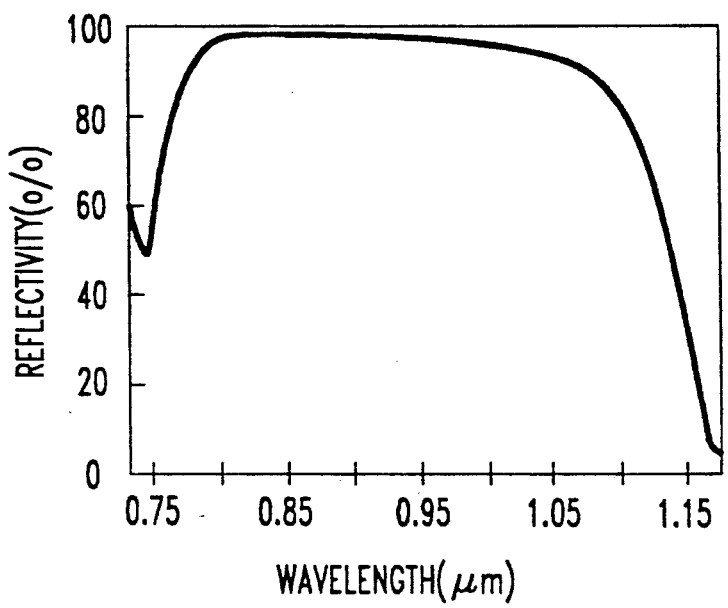
FIG. 2 is a chart representing a Reflectivity versus Wavelength curve measured for a mirror with 6 pairs of ZnS/CaF$_2$.

FIG. 2 shows a reflectivity versus wavelength curve measured for a six pair ZnS/CaF$_2$ quarter-wave mirror on Si. A reflectivity of >97% is obtained at a wavelength range of from 0.80 to 0.90 μm.

Figure 3:
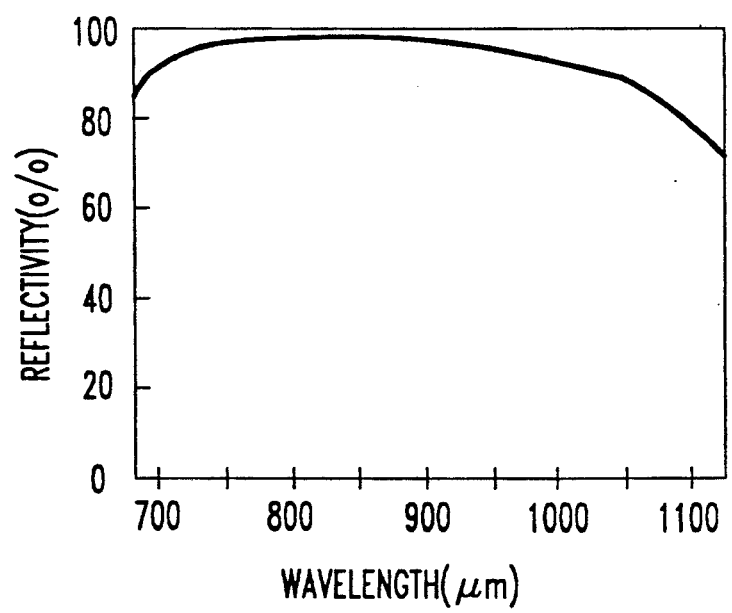
FIG. 3 is a chart representing a Reflectivity versus Wavelength curve measured for a mirror with 3 pairs of GaP/borosilicate glass.
Figure 4:
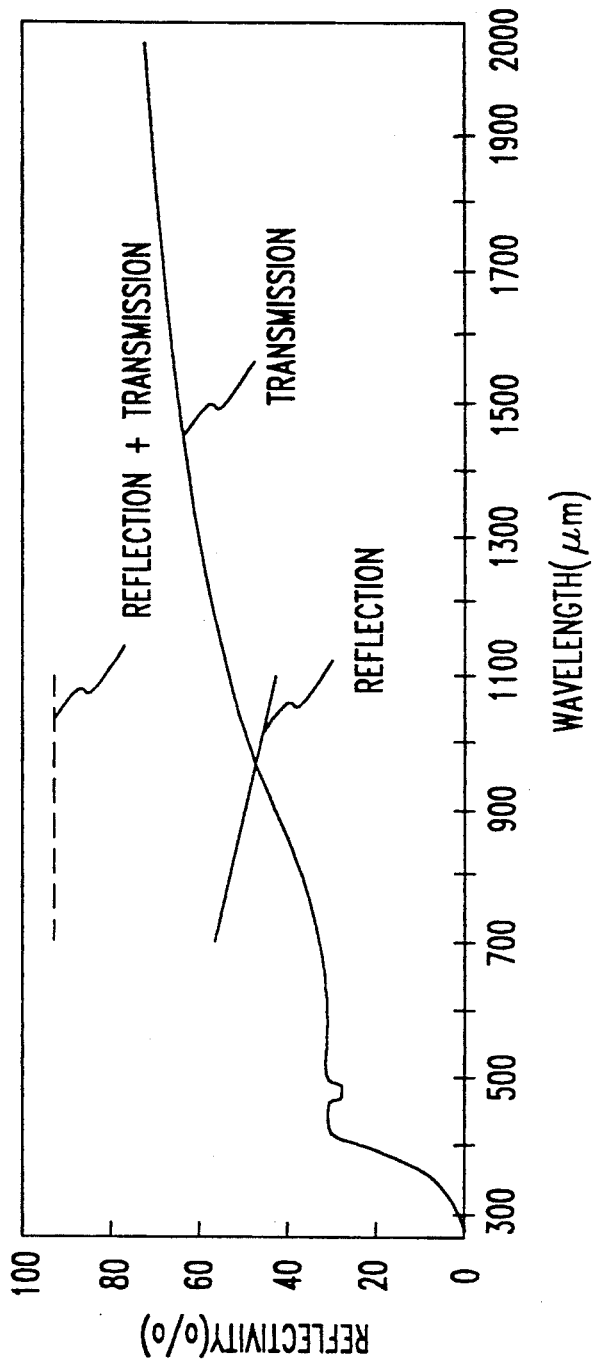
FIG. 4 is a chart representing the measured optical data for a 40 nm thick GaP film on borosilicate glass in terms of transmission and reflection.

FIG. 3 shows a reflectivity versus wavelength curve measured for a 3 pair GaP/BSG quarter-wave mirror on Si. A reflectivity of >97% is obtained at a wavelength of about 0.87 μm. Additionally, a measured optical data in terms of transmission and reflection is shown in FIG. 4 for a 400Å GaP film deposited at a substrate temperature of 250° C. Over the wavelength range of 0.7–1.1 μm no measurable absorption takes place in the GaP film.

We claim:

1. An optical device comprising a semiconductor material selected from the group consisting of III-V and II-VI semiconductors, comprising a lasing cavity and top and bottom metal electrodes for applying electric field to the lasing cavity, said lasing cavity comprises a bottom mirror, a bottom confining region, an active region, a top confining region and a top mirror, said top mirror comprising a plurality of pairs of quarterwave layers, each pair of layers consisting of a low index layer and a high index layer arranged in an alternating sequence beginning with the low index layer, wherein said high index layer is a semiconductor selected from the group consisting of GaP and ZnS, and said low index layer is of a material chosen from the group of materials selected from borosilicate glass (BSG), CaF$_2$, MgF$_2$ and NaF.

2. An optical device of claim 1, in which said pairs of quarterwave layers are layers produced by electron-beam evaporation in vacuum environment with substantial absence of oxygen.

3. The optical device of claim 1, in which said high index layer comprises GaP and said low index layer comprises BSG.

4. The optical device of claim 1, in which the top mirror comprises of three pairs of GaP and BSG layers.

5. The optical device of claim 1, in which said high index layer comprises ZnS and said low index layer comprises CaF$_2$.

6. An optical device of claim 1, in which the top mirror comprises six pairs of ZnS and CaF$_2$ layers.

7. The optical device of claim 1, in which said III-V compound semiconductor is chosen from the group consisting of GaAs, GaInAs, InP, GaInP, GaInPAs, AlAs, AlGaAs, AlGaInAs, AlInP, AlInPAs and AlGaInPAs.

8. The optical device of claim 1, in which said top mirror is in a partial overlapping relation with the top metal electrode having a central opening, the top mirror being a stack of said pairs of wuarterwave layers centered over said central opening.

9. The optical device of claim 1, in which said alternating sequence begins with the low index layer, and in which an additional capping low index layer overlies the uppermost of the high index layers of the device.

* * * * *